United States Patent
Lee et al.

(10) Patent No.: US 7,088,502 B2
(45) Date of Patent: Aug. 8, 2006

(54) SEMICONDUCTOR OPTICAL AMPLIFIER AND OPTICAL AMPLIFYING APPARATUS USING THE SAME

(75) Inventors: Jeong-Seok Lee, Anyang-si (KR); Dong-Han Lee, Daejeon (KR); Jeong-Mee Oh, Daejeon (KR)

(73) Assignee: Samsung Electronics Co.,Ltd., Suwon-Si (KR)

( * ) Notice: Subject to any disclaimer, the term of this patent is extended or adjusted under 35 U.S.C. 154(b) by 0 days.

(21) Appl. No.: 10/939,725

(22) Filed: Sep. 13, 2004

(65) Prior Publication Data
US 2005/0185265 A1 Aug. 25, 2005

(30) Foreign Application Priority Data
Feb. 25, 2004 (KR) .................. 10-2004-0012563

(51) Int. Cl.
*H01S 3/00* (2006.01)
*H04B 10/12* (2006.01)
(52) U.S. Cl. .................... 359/344; 359/334; 359/337.4
(58) Field of Classification Search ............... 359/344, 359/334, 377, 4
See application file for complete search history.

(56) References Cited

U.S. PATENT DOCUMENTS

| | | | | |
|---|---|---|---|---|
| 5,673,141 A | * | 9/1997 | Gambini | 359/341.1 |
| 6,529,315 B1 | * | 3/2003 | Bartolini et al. | 359/334 |
| 6,751,013 B1 | * | 6/2004 | Wu | 359/337 |
| 6,778,320 B1 | * | 8/2004 | Traynor | 359/334 |

* cited by examiner

*Primary Examiner*—Mark Hellner
(74) *Attorney, Agent, or Firm*—Cha & Reiter,L.L.C.

(57) ABSTRACT

A semiconductor optical amplifier for amplifying input optical signals is disclosed. The optical amplifier includes a substrate; a first active layer laminated on the substrate for generating pumping lights; a second active layer laminated on the substrate being gain-clamped by the pumping light and amplifying the input optical signals; and a grating formed on an upper portion of the substrate, adjacent to a boundary between the first active layer and the second active layer, for partially allowing the transmission of the pumping lights to the second active layer and partially reflecting the pumping lights.

18 Claims, 3 Drawing Sheets

SEMICONDUCTOR OPTICAL AMPLIFIER AND OPTICAL AMPLIFYING APPARATUS USING THE SAME

CLAIM OF PRIORITY

This application claims priority to an application entitled "SEMICONDUCTOR OPTICAL AMPLIFIER AND OPTICAL AMPLIFYING APPARATUS USING THE SAME," filed in the Korean Intellectual Property Office on Feb. 25, 2004 and assigned Serial No. 2004-12563, the contents of which are hereby incorporated by reference.

BACKGROUND OF THE INVENTION

1. Field of the Invention

The present invention relates to an optical-transmission apparatus and, more particularly, to an optical-amplifying apparatus used to amplify optical signals.

2. Description of the Related Art

Generally, optical-amplifying apparatuses are used to amplify the intensity of input optical signals and to transmit the amplified optical signals over a long distance with minimum errors. Such optical-amplifying apparatuses have important operation characteristics, such as gain, noise figure, and saturation output power. As erbium doped fiber amplifiers are known to have high gain, low noise figure, and large saturation output power, they have been widely utilized in many backbone networks or metro networks. However, the erbium doped fiber amplifiers have disadvantages in that they are expensive, and have relatively large sizes and limited amplification bands.

In contrast, semiconductor optical amplifiers are capable of solving the short comings of the erbium doped fiber amplifiers in that their costs are low, their sizes are large, and their amplification bands can be relatively and easily adjusted. However, as the semiconductor optical amplifiers have high noise figures, their actual application is inevitably limited.

The conventional semiconductor optical amplifiers tend to be small sizes and their amplification bands can be changed by adjusting the composition of gain materials. Moreover, they can be manufactured at a low cost.

In the case of general gain-clamped semiconductor optical amplifiers, they have good gain precedence and saturation output power. However, as they have a very high noise figure of more than 8 dB, they have many limitations when they are used in transmission systems. In the case of Raman amplifiers, they have very low noise figures. However, since they have a very low-light amplification efficiency, they require high power laser diodes in order to obtain enough gain.

In order to solve these disadvantages, a new optical-amplifying apparatus technology has been recently proposed, which has a structure that combines a Raman amplifier and a semiconductor optical amplifier. In such a combined structure, an optical signal obtains Raman gain before being inputted to the semiconductor optical amplifier, so that effective gain is increased. In addition, a signal-to-noise ratio (SNR) of the semiconductor optical amplifier can be improved by the Raman gain, so that the effective noise figure is reduced.

FIG. 1 shows a conventional optical-amplifying apparatus. As shown, the optical-amplifying apparatus includes a single mode fiber (SMF) 110, a Raman optical amplifier constructed with a wavelength selective coupler (WSC) 130 and a laser diode (LD) 120, and a semiconductor optical amplifier (SOA) 140.

In operation, the laser diode 120 outputs a pumping light $S_2$ having a wavelength of 1400 nm to 1500 nm. The wavelength selective coupler 130 has a first port connected to the single mode fiber 110, a second port connected to the semiconductor optical amplifier 140, and a third port connected to the laser diode 120. Thus, the wavelength selective coupler 130 provides the single mode fiber 110 with the pumping light $S_2$ inputted to the third port, and outputs a Raman-amplified optical signal $S_1$ inputted to the first port to the second port.

The single mode fiber 110 is pumped by the pumping light $S_2$, and then Raman-amplifies and outputs the optical signal $S_1$ inputted via a stimulated Raman-scattering effect. The semiconductor optical amplifier 140 amplifies and outputs the Raman-amplified optical signal $S_1$.

However, the conventional optical-amplifying apparatus as described above has a hybrid structure, defined by the semiconductor optical amplifier and the Raman optical amplifier, and integrates an expensive laser diode with the semiconductor optical amplifier, thereby increasing the material cost and the manufacturing cost. In addition, a separate wavelength selective coupler is required in order to integrate two devices with each other, and optical loss occurring in the connection portion between the devices deteriorates the optical amplification characteristic. Furthermore, a larger space is required in order to install the combined devices.

SUMMARY OF THE INVENTION

Accordingly, the present invention has been made to solve the above-mentioned problems occurring in the prior art and provides additional advantages, by providing an optical-amplifying apparatus and a semiconductor optical amplifier that are economical and capable of improving the output characteristic.

According to one aspect of the present, there is provided a semiconductor optical amplifier comprising: a substrate; a first active layer laminated on the substrate for generating pumping lights; a second active layer laminated on the substrate and coupled to the first active layer, which is being gain-clamped by the pumping light, and for amplifying and outputting an inputted optical signal; and a grating formed on an upper portion of the substrate, which is adjacent to a boundary between the first active layer and the second active layer, the grating partially allowing the transmission of the pumping lights to the second active layer and partially reflecting the pumping lights.

BRIEF DESCRIPTION OF THE DRAWINGS

The above features and advantages of the present invention will be more apparent from the following detailed description taken in conjunction with the accompanying drawings, in which.

DETAILED DESCRIPTION OF THE INVENTION

Hereinafter, an embodiment according to the present invention will be described with reference to the accompanying drawings. For the purposes of clarity and simplicity, a detailed description of known functions and configurations incorporated herein will be omitted as it may make the subject matter of the present invention unclear.

Figure 1:
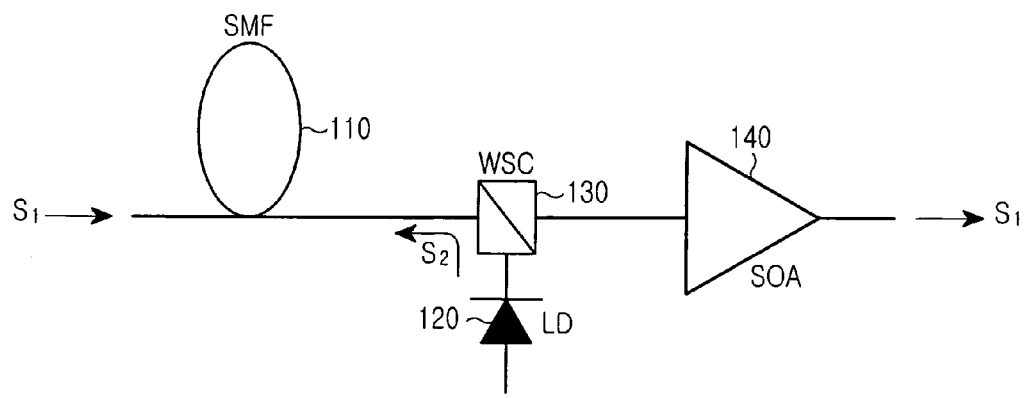
FIG. 1 shows a conventional optical-amplifying apparatus.
Figure 2:
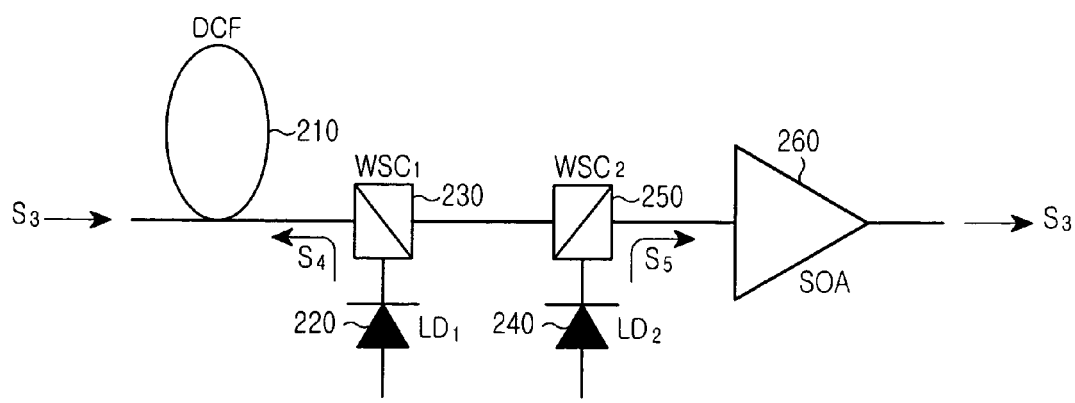
FIG. 2 is a view illustrating a basic operation principle of the present invention.

FIG. 2 shows a simplified schematic diagram illustrating the basic operation principle according to the teachings of the present invention. As shown, the optical-amplifying apparatus includes a dispersion-compensated fiber (DCF) 210, a first and a second wavelength selective coupler 230 and 250, a first and a second pumping light source 220 and 240, and a semiconductor optical amplifier 260.

The first pumping light source 220 outputs a first pumping light $S_4$ having a wavelength of 1400 nm to 1500 nm. The second pumping light source 240 outputs a second pumping light $S_5$ having a wavelength of 1400 nm to 1500 nm.

The first and the second pumping light source 220 and 24 each may include laser diodes.

The first wavelength selective coupler 230 has a first port connected to the dispersion compensated fiber 210, a second port connected to the second wavelength selective coupler 250, and a third port connected to the first pumping light source 220. The first wavelength selective coupler 230 provides the dispersion compensated fiber 210 with the first pumping light $S_4$ inputted to the third port, and outputs a Raman-amplified optical signal $S_3$ inputted to the first port to the second port.

The dispersion compensated fiber 210 is pumped by the first pumping light $S_4$, and Raman-amplifies and outputs the optical signal $S_3$ inputted by the stimulated Raman-scattering effect. Further, the dispersion compensated fiber 210 compensates for the dispersion of the optical signal $S_3$ and may employ a single-mode fiber. In that case, the single-mode fiber Raman-amplifies and outputs an inputted optical signal, but does not compensate for the dispersion of the optical signal.

The second wavelength selective coupler 250 has a first port connected to the second port of the first wavelength selective coupler 230, a second port connected to the semiconductor optical amplifier 260, and a third port connected to the second pumping light source 240. Further, the second wavelength selective coupler 250 provides the semiconductor optical amplifier 260 with the second pumping light $S_5$ inputted to the third port, and outputs the Raman-amplified optical signal $S_3$ inputted to the first port to the second port.

The gain of the semiconductor optical amplifier 260 is clamped by the second pumping light $S_5$, and the amplifier 260 has an active layer for amplifying and outputting the inputted Raman-amplified optical signal $S_3$. Note that as the second pumping light $S_5$ has a wavelength that is substantially shorter than the gain wavelength of the semiconductor optical amplifier 260, the second pumping light $S_5$ plays a role of clamping the gain of the semiconductor optical amplifier 260.

Figure 3:
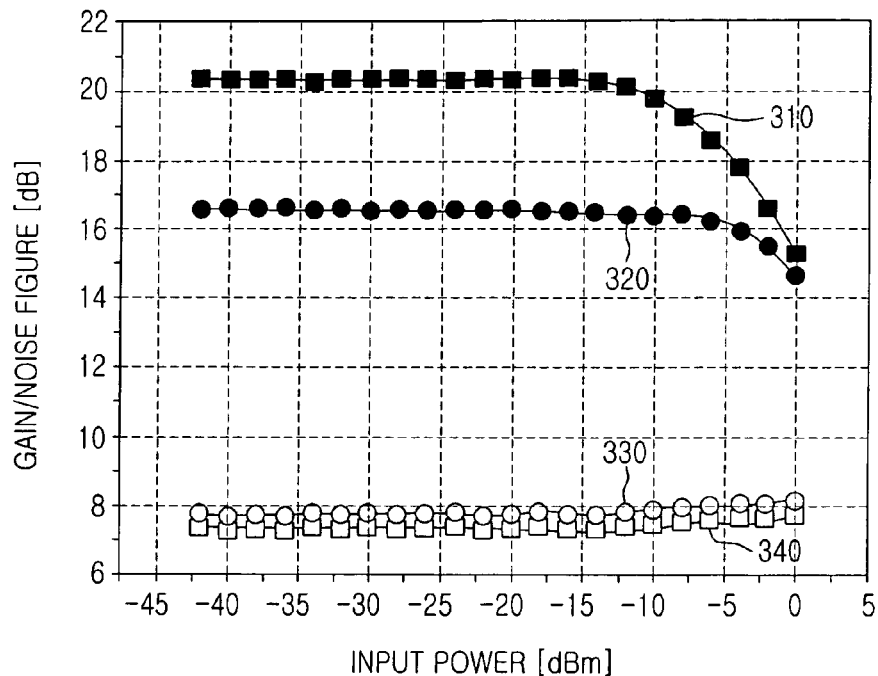
FIG. 3 is a graph illustrating an output characteristic of the optical-amplifying apparatus shown in FIG. 2.

FIG. 3 is a graph illustrating the output characteristic of the optical-amplifying apparatus shown in FIG. 2.

A first gain curve 310 represents the gain of the optical-amplifying apparatus when the second pumping light source 240 is in an off-state, and a second gain curve 320 represents the gain of the optical-amplifying apparatus when the second pumping light source 240 is in an on-state. A first noise figure curve 340 represents the noise figure of the optical-amplifying apparatus when the second pumping light source 240 is in an off-state, and a second noise figure curve 330 represents the noise figure of the optical-amplifying apparatus when the second pumping light source 240 is in an on-state. Accordingly, the optical amplifying apparatus according to the teachings of the present invention can obtain a gain-clamping effect of the semiconductor optical amplifier 260 using the second pumping light $S_5$ as shown in FIG. 3.

Figure 4:
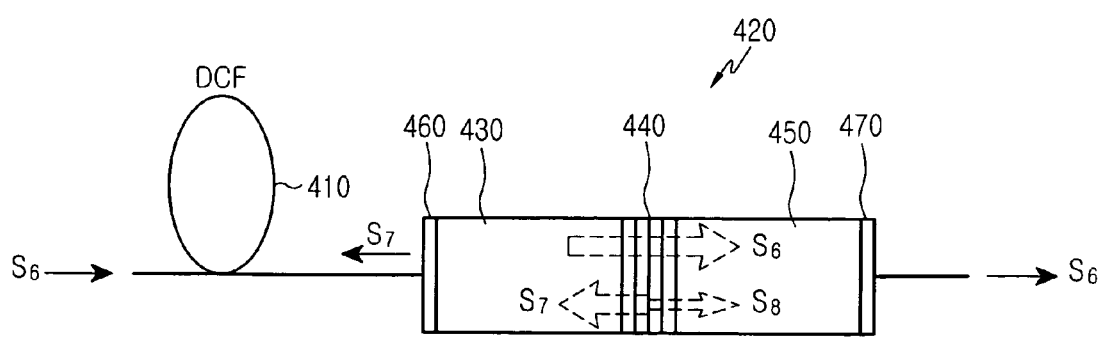
FIG. 4 shows the construction of an optical-amplifying apparatus according to a preferred embodiment of the present invention.
Figure 5:
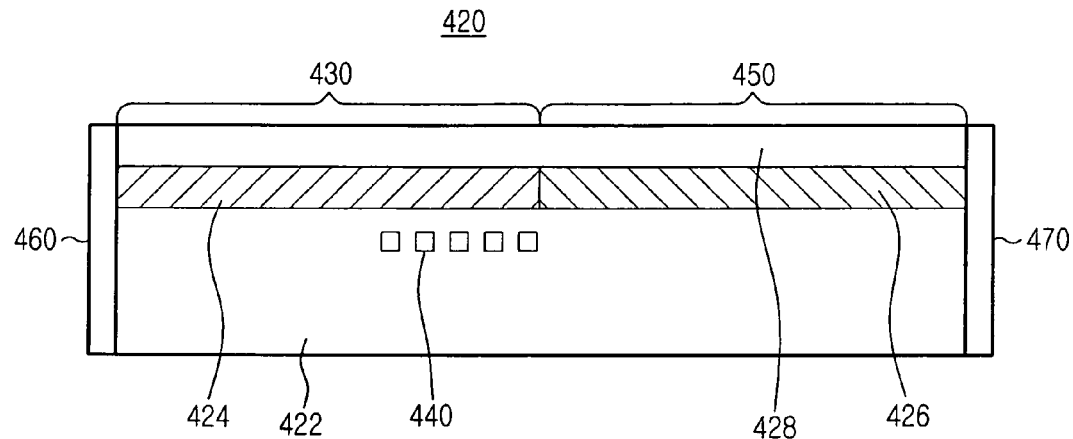
FIG. 5 is a detailed view of the semiconductor optical amplifier shown in FIG. 4; and, FIG. 6 is a graph illustrating the output characteristic of the optical-amplifying apparatus shown in FIG. 4.

FIG. 4 illustrates the construction of an optical-amplifying apparatus according to an embodiment of the present invention, and FIG. 5 illustrates the semiconductor optical amplifier shown in FIG. 4 in more detail. As shown, the optical-amplifying apparatus includes a dispersion compensated fiber (or a single mode fiber) 410 and a semiconductor optical amplifier 420.

The semiconductor optical amplifier 420 includes a substrate 422, a first and a second active layer 424 and 426, a clad 428, a low-reflection coating layer 460, and an anti-reflection coating layer 470. Further, the semiconductor optical amplifier 420 includes an oscillation area 430 and an amplifying area 450 in relation to the first active layer 424 and the second active layer 426. The oscillation area 430 generates a pumping light and the amplifying area 450 amplifies an inputted Raman-amplified optical signal $S_6$.

The substrate 422 has a grating 440 at an upper portion thereof. Herein, the grating 440 belongs to the oscillation area 430 and is formed so as to be adjacent to the boundary between the first active layer 424 and the second active layer 426.

The first active layer 424 belongs to the oscillation area 430 and is laminated on the substrate 422 to generate pumping lights having a wavelength of 1400 nm to 1500 nm according to the input of electric current. Further, a lasing direction of the first active layer 424 is set to be opposite to the input direction of the Raman-amplified optical signal $S_6$.

The second active layer 426 belongs to the amplifying area 450 and is laminated on the substrate 422, and it amplifies and outputs the inputted Raman-amplified optical signal $S_6$ according to the input of electric current. The first active layer 424 and the second active layer 426 are coupled to each other using a butt-joint method.

Since the first active layer 424 has an oscillation wavelength (i.e., wavelength of the pumping light) shorter than the wavelength of the Raman-amplified optical signal $S_6$, the Raman-amplified optical signal $S_6$ is not absorbed into the first active layer 424, but is inputted to the second active layer 426.

The grating 440 stabilizes the oscillation wavelength of the first active layer 424, thereby stabilizing a Raman-gain characteristic obtained by the pumping light. A portion of the pumping lights generated by the first active layer 424 are partially transmitted by the grating 440, and the other portion of the pumping lights are reflected by the grating 440. The transmitted pumping light $S_8$ is inputted to the second active layer 426. Herein, since the transmitted pumping light $S_8$ has a wavelength that is much shorter than a gain wavelength of the second active layer 426, the transmitted pumping light $S_8$ plays a role of clamping the gain in the second active layer 426. The reflected pumping light $S_7$ is provided to the dispersion compensated fiber 410.

The clad 428 is laminated on the first and the second active layer 424 and 426, and confines a light inside the first and second active layers 424 and 426 together with the substrate 422.

The low-reflection coating layer 460 is coated at one end surface of the semiconductor optical amplifier 420, which is adjacent to the oscillation area 430, and has a low-reflection factor.

The antireflection coating layer 470 is coated on the other end surface of the semiconductor optical amplifier 420, which is adjacent to the amplifying area 450, and has a reflection factor with a value near to 0.

In operation, the dispersion compensated fiber 410 is pumped by the reflected pumping light $S_7$, and Raman-amplifies and outputs the optical signal $S_6$ inputted by the stimulated Raman-scattering effect. Further, the dispersion compensated fiber 410 compensates for the dispersion of the optical signal $S_6$ and may employ a single-mode fiber. In that case, the single-mode fiber Raman-amplifies and outputs an inputted optical signal but does not compensate for the dispersion of the optical signal.

Figure 6:
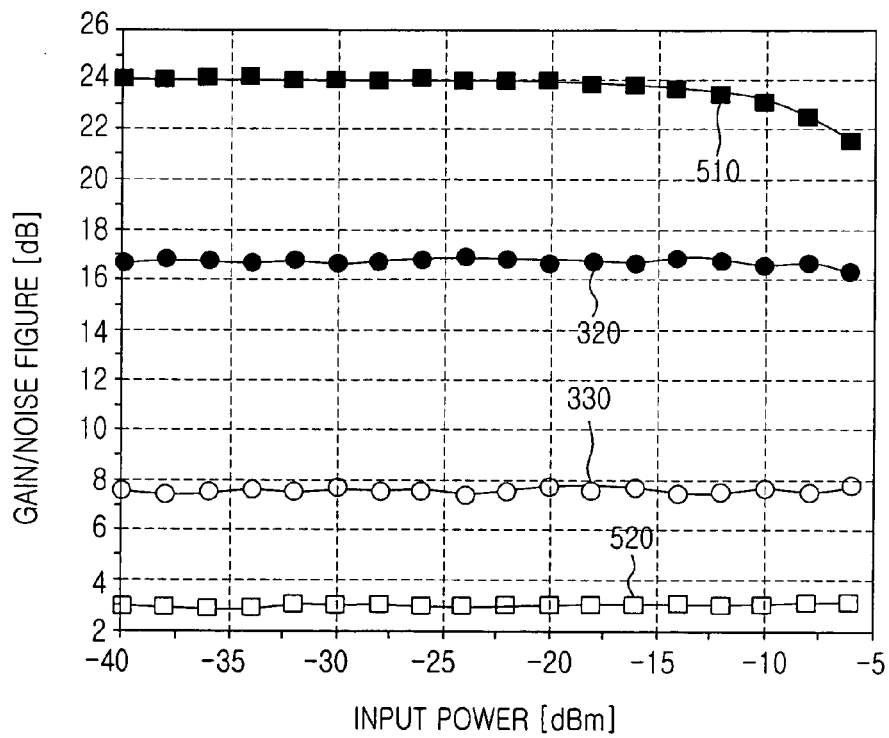

FIG. 6 is a graph illustrating the output characteristic of the optical-amplifying apparatus shown in FIG. 4. For the purpose of comparison with FIG. 3, FIG. 6 shows a third gain curve 510 and a third noise figure curve 520 of the optical-amplifying apparatus together with the second gain curve 320 and the second noise figure curve 330.

The third gain curve 510 represents the gain of the optical-amplifying apparatus, and the third noise figure curve 520 represents the noise figure of the optical-amplifying apparatus. As shown in FIG. 6, the optical-amplifying apparatus can obtain a gain-clamping effect of the second active layer 426 and a Raman-amplification effect by the transmitted pumping light $S_8$. Further, the optical-amplifying apparatus has a noise figure smaller than 3 dB due to the Raman-amplification effect.

As described above, an optical amplifying apparatus according to the present invention uses a gain-clamped semiconductor optical amplifier combining the functions of a Raman amplifier and a pumping-light source, thereby reducing the noise figure and increasing the effective gain.

Further, according to the present invention, since the semiconductor optical amplifier simultaneously performs the functions of a pumping light source and an optical amplifier while having the same module structure as that of the existing semiconductor optical amplifier, an optical-amplifying apparatus using the semiconductor optical amplifier has a small size and low cost in comparison with the conventional hybrid-type optical-amplifying apparatus.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A semiconductor optical amplifier comprising:
    a substrate;
    a first active layer laminated on the substrate for generating pumping lights;
    a second active layer laminated on the substrate and coupled to the first active layer for amplifying an input optical signal, the second active layer being gain-clamped by the pumping lights; and,
    a grating formed on an upper portion of the substrate adjacent to a boundary between the first active layer and the second active layer for partially allowing the transmission of the pumping lights to the second active layer and partially reflecting the pumping lights.

2. The semiconductor optical amplifier as claimed in claim 1, wherein the grating is located below the first active layer.

3. The semiconductor optical amplifier as claimed in claim 1, further including a low-reflection layer coated at a first end surface of the semiconductor optical amplifier, and an anti-reflection layer coated on a second end surface of the semiconductor optical amplifier.

4. The semiconductor optical amplifier as claimed in claim 1, wherein the first active layer generates pumping lights having a wavelength of 1400 nm to 1500 nm.

5. The semiconductor optical amplifier as claimed in claim 4, wherein the grating stabilizes an oscillation wavelength of the first active layer.

6. An optical amplifying apparatus comprising:
    an optical fiber for Raman-amplifying and outputting an input optical signal;
    a semiconductor optical amplifier for providing pumping lights to the optical fiber, and amplifying and outputting the Raman-amplified optical signal, wherein the semiconductor optical amplifier tier comprises:
    a substrate;
    a first active layer laminated on the substrate for generating the pumping lights;
    a second active layer laminated on the substrate and coupled to the first active layer for amplifying and outputting an inputted Raman-amplified optical signal, the second active layer being gain-clamped by the pumping lights; and
    a grating formed on an upper portion of the substrate adjacent to a boundary between the first active layer and the second active layer for partially allowing the transmission of the pumping lights to the second active layer and partially reflecting the pumping lights,
    wherein a gain of the second active layer is clamped by the transmitted pumping lights, and the reflected pumping lights are provided to the optical fiber.

7. The optical-amplifying apparatus as claimed in claim 6, wherein the optical fiber includes a dispersion-compensated fiber or a single-mode fiber.

8. The semiconductor optical amplifier as claimed in claim 6, further including a low-reflection layer coated at a first end surface of the semiconductor optical amplifier, and an anti-reflection layer coated on a second end surface of the semiconductor optical amplifier.

9. The semiconductor optical amplifier as claimed in claim 6, wherein the first active layer generates pumping lights having a wavelength of 1400 nm to 1500 nm.

10. The semiconductor optical amplifier as claimed in claim 6, wherein the grating stabilizes an oscillation wavelength of the first active layer.

11. The semiconductor optical amplifier as claimed in claim 6, wherein the first active layer has an oscillation wavelength shorter than the wavelength of the Raman-amplified optical signal.

12. The semiconductor optical amplifier as claimed in claim 6, wherein the Raman-amplified optical signal $S_6$ is not absorbed into the first active layer but inputted to the second active layer.

13. The semiconductor optical amplifier as claimed in claim 6, wherein the transmitted pumping lights have a wavelength shorter than a gain wavelength of the second active layer.

14. The semiconductor optical amplifier as claimed in claim 6, further comprising a clad laminated on the first and the second active layers.

15. An optical-amplifying apparatus comprising:
- a dispersion-compensated fiber (DCF);
- a semiconductor optical amplifier; and
- a first light source coupled to the dispersion compensated fiber for Raman-amplifying an optical signal, and a second pumping light source for clamping a gain of the semiconductor optical amplifier.

16. The optical-amplifying apparatus as claimed in claim 15, wherein the first pumping light source outputs a first pumping light having a wavelength of 1400 nm to 1500 nm.

17. The optical-amplifying apparatus as claimed in claim 15, wherein the second pumping light source outputs a second pumping light having a wavelength of 1400 nm to 1500 nm.

18. The optical-amplifying apparatus as claimed in claim 15, wherein the second pumping light has a wavelength that is substantially shorter than the gain wavelength of the semiconductor optical amplifier.

* * * * *